United States Patent [19]

Ruparel

[11] Patent Number: 5,689,517
[45] Date of Patent: Nov. 18, 1997

[54] APPARATUS FOR SCANNABLE D-FLIP-FLOP WHICH SCANS TEST DATA INDEPENDENT OF THE SYSTEM CLOCK

[75] Inventor: Kamalesh Ruparel, San Jose, Calif.

[73] Assignee: Apple Computer, Inc., Cupertino, Calif.

[21] Appl. No.: 686,506

[22] Filed: Jul. 26, 1996

Related U.S. Application Data

[63] Continuation of Ser. No. 234,859, Apr. 28, 1994, abandoned.
[51] Int. Cl.$^6$ .................................................. G01R 31/28
[52] U.S. Cl. ........................... 371/22.3; 371/22.5; 307/418
[58] Field of Search ................................. 371/22.3, 22.5, 371/22.1; 307/409, 418; 365/154, 189.05

[56] References Cited

U.S. PATENT DOCUMENTS

| | | |
|---|---|---|
| 4,495,628 | 1/1985 | Zasio . |
| 4,495,629 | 1/1985 | Zasio et al. . |
| 4,912,709 | 3/1990 | Teske et al. .......................... 371/22.1 |
| 5,003,204 | 3/1991 | Cushing et al. ........................ 307/465 |
| 5,130,568 | 7/1992 | Miller et al. .......................... 307/272.2 |
| 5,257,223 | 10/1993 | Dervisoglu ............................ 365/154 |

OTHER PUBLICATIONS

Electronic Engineering, vol. 63, No. 777, Sep. 1991 London GB, pp. 35–36&38, S. Yurash, et al. "Automatic Test Pattern Generation Comes of Age".
–E.B. Eichelberger et al., "A Logic Design Structure for LSI Testability," Reprinted from The Proceedings of the 14th Design Automation Conference by the Institute of Electrical and Electronics Engineers,Inc., pp. 206–212 (1977).

*Primary Examiner*—Robert W. Beausoliel, Jr.
*Assistant Examiner*—Nadeem Iqbal
*Attorney, Agent, or Firm*—Blakely, Sokoloff, Taylor & Zafman

[57] ABSTRACT

The present invention discloses an apparatus for controlling and observing test data stored in scannable-D-flip-flops independent of a system clock, thereby making the scannable-D-flip-flops well suited for partial scanning Design-For-Test (DFT) techniques. Under the present invention, the scannable-D-flip-flop is comprised of two master latches and one slave latch such that the scannable-D-flip-flops may operate in a normal mode of operation or a scan/test mode of operation. During normal mode of operation, the first master latch operates together with the slave latch in response to the system clock. During the scan/test mode of operation, the second master latch operates together with the slave latch in response to a scan clock. Since the scanning of external test data is controlled by the scan clock, the conventional non-scannable D-flip-flops in the design, which are controlled by the system clock, maintain their previous states during a scanning operation. Also disclosed is a method for performance testing integrated circuits utilizing the scanning application of the scannable-D-flip-flops. This is accomplished by constructing a test circuit that spans the entire silicon die area. By using a special AC-TEST-MODE control signal, the scannable D-flip-flops are set to a "flow-through" mode to provide a direct path through the scannable flip-flops such that the test circuit forms an oscillator in which the frequency of the device can be measured.

12 Claims, 11 Drawing Sheets

APPARATUS FOR SCANNABLE D-FLIP-FLOP WHICH SCANS TEST DATA INDEPENDENT OF THE SYSTEM CLOCK

This is a continuation of application Ser. No. 08/234,859, filed Apr. 28, 1994, now abandoned.

BACKGROUND

The present invention relates to memory storage devices and more particularly to memory storage devices, such as flip-flops, which are testable. Today, with the extensive utilization of LSI and VLSI technology, and with the explosive growth in the availability of complex IC devices, it is apparent that careful consideration should be taken during the component design stage in order to insure adequate testability and producibility of digital ICs. This proliferation of complex IC devices has led to the need for more rigorous and highly structured device design practices to provide for adequate testing developed in a timely and cost-efficient manner.

Structured design, otherwise known as scan design is a design-for-test (DFT) technique in which storage elements, except those in storage arrays, can be controlled and observed. The most common form of scan design is the serial scan in which storage elements are connected to form one or more shift registers for testing. Most scan design practices are built on the concept that if the value of all of the latches internal to the design can be controlled to specific values and observed with a straight forward operation, then the task of test generation, and possibly fault simulation, can be reduced to that of doing test generation and fault simulation for a combinatorial logic circuit. A control signal can switch the storage elements from their normal mode of operation to a mode that makes them controllable and observable.

Figure 1A:
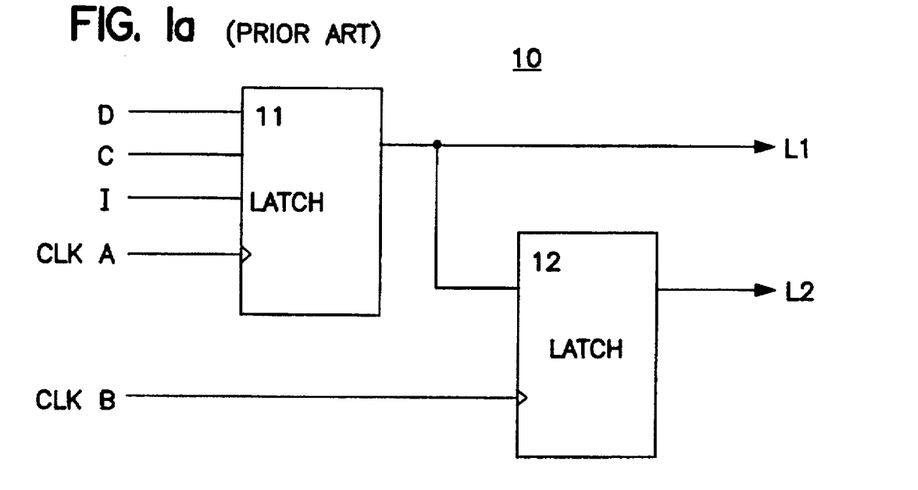
FIGS. 1a–c illustrate a prior art fully structured approach utilizing a shift register latch (SRL) as the scan design element.
Figure 1B:
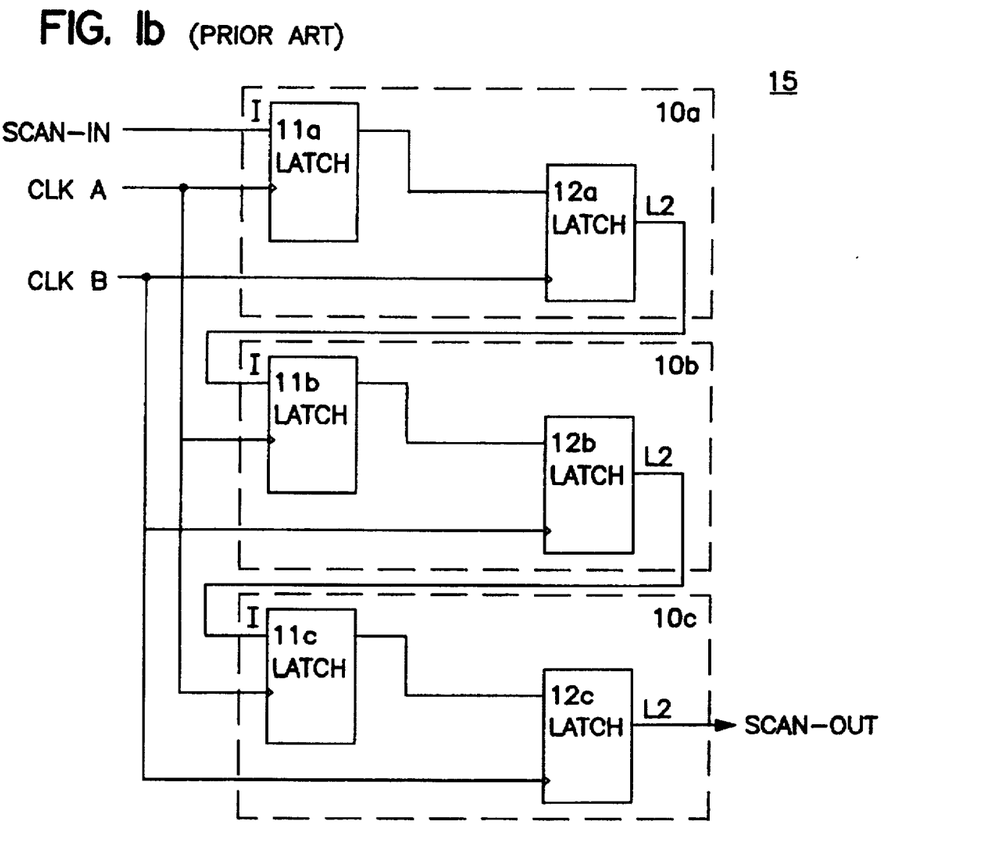
Figure 1C:
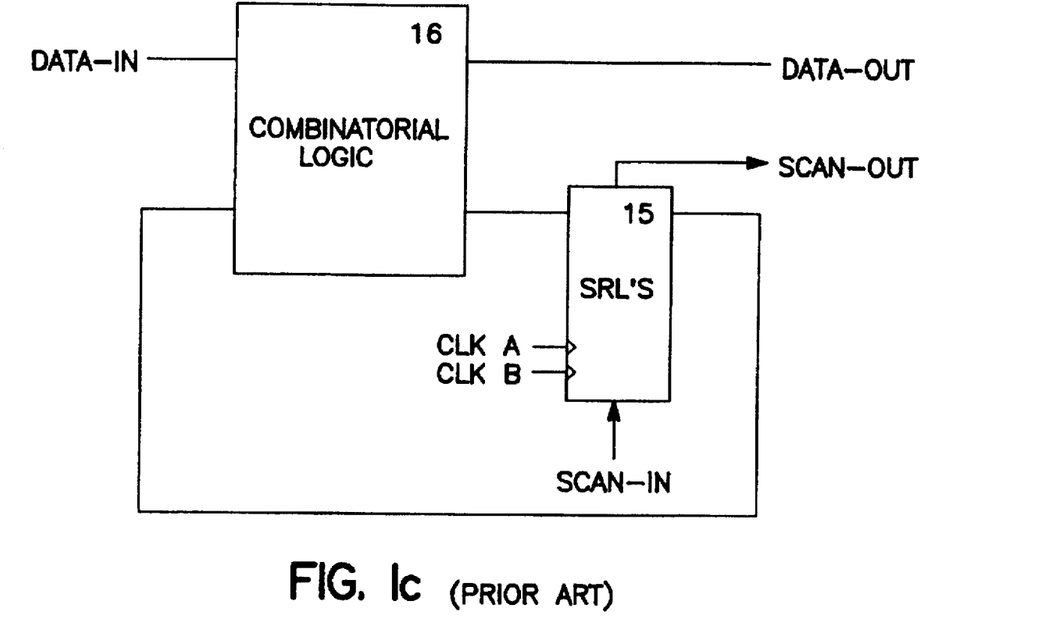

Over 20 years ago, IBM developed the structural design technique referred to as the level-sensitive scan design (LSSD). According to the LSSD technique, scan refers to the ability to shift any state into or out of the circuit and level sensitive refers to constraints on circuit excitation, logic depth, and the handling of clocked circuitry. A key element in the design is the shift register latch pair (SRL) 10 as shown in FIG. 1a which includes latch 11 and latch 12. Data inputs D and C form the normal mode memory function, while data input I, clock input A and clock input B, together with latch 12 compose additional circuitry for the shift register function. The extra data input I, clock input A and clock input B of SRL 10 allow each latch to be set to any state directly. The individual latches are cascaded to form an on-chip SRL scan chain 15 shown in FIG. 1b with clock A and clock B operating in a two-phase fashion. SRL scan chain 15 consists of three SRLs 10a, 10b and 10c that are cascaded by connecting the L2 output of latch 12a to the input I of latch 11b and the output L2 of latch 12b to the input I of latch 11c. The input I of latch 11a is the scan-in input of SRL scan chain 15 and the L2 output of latch 12c is the scan-out output of the scan chain. Furthermore, FIG. 1c illustrates a generalized LSSD approach block diagram such that a LSSD design circuitry 17 can be thought of as combinatorial logic 16 interconnected to the SRL scan chain 15.

The basic idea behind using the extra circuitry, which can consume up to 20 percent of the available functional circuitry on an IC, is to make sequential circuitry look combinatorial during testing. In otherwords, the extra circuitry provides the capability to force states at any node and to similarly be able to observe the state of any node. The extra inputs allow any latch to be set or reset by cycling the A and B clock inputs between the logic 0 and logic 1 levels. The design of the scan circuitry 17 allows automatic test generation programs to treat even sequential circuitry as simple combinatorial circuitry. Full scan designs, such as those that use full LSSD, essentially reduce the problem of test generation for a sequential ciurcuit to that of a combinatorial one.

Although the LSSD structured design approach for design for testability can alleviate some of the problems in designing, manufacturing, and maintaining LSI/VLSI systems at a reasonable cost, the LSSD design philosophy can have some negative impacts on cost and as well as performance. First of all, the shift register latches in the shift register are two or three times as complex as simple latches. Up to four additional primary inputs/outputs are required at each package level for control of the shift registers. External asynchronous input signals must not change more than once every clock cycle. Finally, all timing within the subsystem may be controlled by internally generated clock signals.

While scan methodologies, which includes LSSD as well as other scan technologies, may offer the advantages of fully structured test generation and testing techniques, strict adherence to scan-based designs can sometimes actually increase product costs. The long test sequences required for scannable designs can increase test time, which can, in turn, limit production throughput. Furthermore, as the industry moves toward larger and more complex IC devices, routing becomes more of a design limitation making it impractical to make every D-flip-flop in the design scannable. Thus, scan design, while well known and widely discussed, has not been widely adopted. It is apparent that a fully structured approach, while sometimes desirable, is not always necessary. In recent years, software algorithms for test generation have been improving, albeit slowly, to handle partially sequential (and hence partially scannable) circuits with certain limitations. This has led to the development and implementation of partial scan design techniques. Partial scan is a DFT technique that requires only a subset of all circuit D-flop-flops to be scannable, unlike the fully structured technique which requires all memory storage-elements to be scannable. Only a few physical device I/O pins and very little on-chip overhead, compared to full scan techniques, are required for the test circuitry when using a partial scan technique.

Figure 2A:
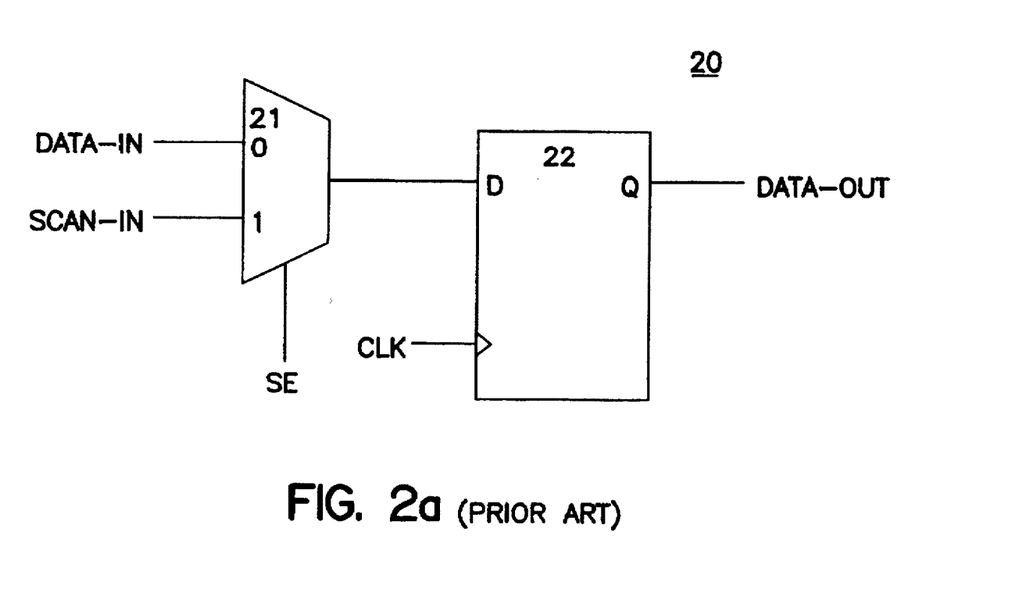
FIGS. 2a–b illustrate a prior art partial scan approach utilizing a mux-type-scan-D-flip-flop as the scan design element.

The most widely adopted scan technique is the mux-type-scan-D-flip-flop shown in FIG. 2a in which multiplexer 21 is used in conjunction with D-flip-flop 22. D-flip-flop 22 is typically a conventional D-flip-flop consisting of a master latch and a slave latch that operate together in response to a system clock. Multiplexer 21, connected to the input of D-flip-flop 22 enables the mux-type-scannable-D-flip-flop 20 to select either Data-In input or Scan-In input by using a scan enable control signal (SE). Thus, mux-type-scan-D-flip-flop 20 may operate as a conventional D-flip-flop during normal mode of operation (with the Data-In input selected by the multiplexer 21) or as a scannable D-flip-flop during scan mode of operation. During normal operation, multiplexer 21 passes the data from the Data-In input of multiplexer 21 through to the Data-Out output of D-flip-flop 22. On the other hand, when the scan mode of operation is selected, data can be fed into the Scan-In input and passed through to the Data-Out output of D-flip-flop 22 to be scanned.

Figure 2B:
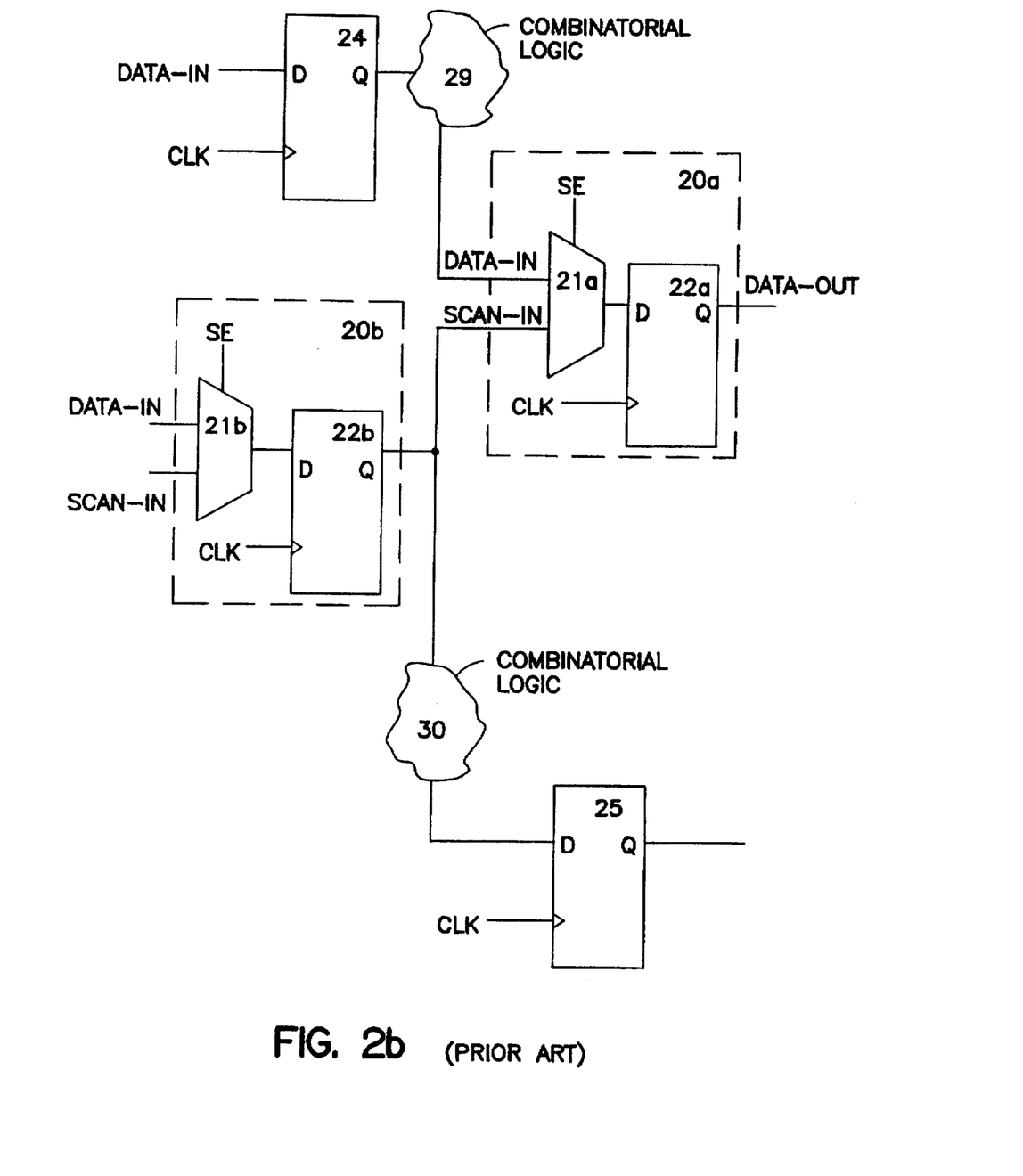

For the purposes of test generation, only those flip-flops in the circuit that are difficult to control and observe need to be made scannable. Software algorithms that use partial scan methodologies allow these critical nodes within the circuit under test to be identified and observed, and each such node is augmented with a scannable D-flip-flop circuit that can be used to control and observe the circuit under test. These scannable D-flip-flop circuits are then connected in series, very much like a scan chain, to allow the needed communication with the critical internal nodes for the device under test. FIG. 2b illustrates a partial scan chain 23 utilizing the mux-type-scan-D-flip-flop. Partial scan chain 23 comprises of two mux-type-scan-D-flip-flops designated by 20a and 20b and two conventional (non-scannable) D-flip-flops 24 and 25. D-flip-flop 24 is coupled to mux-type-scan-D-flip-flop 20a, comprised of multiplexer 21a and D-flip-flop 22a, through combinatorial logic 29. Mux-type-scan-D-flip-flop 20b, comprised of multiplexer 21b and D-flip-flop 22b, is coupled to D-flip-flop 25 through combinatorial logic 30. Mux-type-scan-D-flip-flop 20b is connected directly to mux-type-scan-D-flip-flop 20a as consecutive elements of the partial scan chain (shift register). Combinatorial logic 29 and 30 may be the same or separate function logic. Furthermore, partial scan chain 23 may be expanded to include additional conventional D-flip-flops as well as mux-type-scannable-D-flip-flops.

When the normal mode of operation of mux-type-scan-D-flip-flop 20a is selected, the Data-In input of multiplexer 21a is selected such that D-flip-flop 22a receives data which was processed through combinatorial logic 29, which received as an input the data at the Q output previously stored in D-flip-flop 24. On the other hand, when the scan mode of operation of mux-type-scan-D-flip-flop 20a is selected, the Scan-In input of multiplexer 21a is selected such that D-flip-flop 22a receives data which was previously stored in mux-type-scan-D-flip-flop 20b.

The mux-type-scan-D-flip-flop 20 approach for partial scan DFT scheme has not been widely accepted due to the fact that the non-scan D-flip-flops (e.g. flip-flop 20) can not hold their states while scanning the mux-type-scan-D-flip-flops. This is because, in order to load scan data into the scannable D-flip-flops, it is necessary to toggle the clock, which happens to be the same clock feeding the non-scan D-flip-flops. Unfortunately, the tools used to implement partial-scan based sequential automatic-test-pattern-generation (ATPG) perform very poorly when the non-scan D-flip-flops can not hold their previous states during scan loading, thereby making this type of testing ineffective and inefficient. Furthermore, the multiplexer adversely impacts the set-up and hold timing of Data-In at input D of D-flip-flop 22a and similarly at the D input of flip-flop 22b and the gate count of the scannable D-flip-flip 20a is increased by one multiplexer as compared to the conventional D-flip-flop 24.

BRIEF DESCRIPTION OF THE DRAWINGS

The objects, features, and advantages of the present invention will be apparent from the following detailed description of the preferred embodiment of the invention with references to the drawings in which.

SUMMARY OF THE INVENTION

An apparatus for controlling and observing test data stored in scannable-D-flip-flops independent of a system clock is disclosed. The apparatus has particular application for partial-scan Design-For-Test (DFT) techniques. Furthermore, a method for performance testing integrated circuits (ICs) utilizing the scanning application of the scannable-D-flip-flops is disclosed.

Under the present invention, the scannable-D-flip-flop is comprised of two master latches and one slave latch such that the scannable-D-flip-flop may operate in a normal mode of operation or a scan/test mode of operation. During normal mode of operation, the first master latch operates together with the slave latch in response to the system clock. During the scan/test mode of operation, the second master latch operates together with the slave latch in response to a scan clock. Furthermore, the scan/test mode of operation provides an additional performance testing function for the IC containing the scannable-D-flip-flops.

It is desirable to produce significantly higher fault coverages and more efficient test generation times for partial-scan applications. This is accomplished by the ability of the present invention to scan external test data independently of a system clock. By scanning external test data independently of the system clock, the conventional non-scannable D-flip-flops in the design maintain their previous states during a scanning operation. In contrast, a conventional mux-type-scan-D-flip-flop approach, which requires the usage of the same system clock for both the scannable and non-scannable D-flip-flops during a scan operation, loses data stored in the non-scannable D-flip-flops when a scanning operation is performed with the system clock.

It is also desirable to reduce the overall scan/test logic silicon area overhead required by the design while attempting to achieve a high fault coverage. By allowing an Automatic Test Pattern Generation (ATPG) tool to select fewer D-flip-flops in the design for scanning, the scan/test silicon overhead is significantly reduced. Furthermore, since the design requires only one extra clock for the scan operation, the scan/test logic area overhead at the device level as well as at the chip-level is maintained at significantly low levels.

It is also desirable to provide a scan function without any impact on the setup-time and minimal impact on the hold-time required on the functional path of the D-flip-flop. In a mux-type-scan-D-flip-flop, a multiplexer device is placed on the functional path of scannable D-flip-flops to achieve the scanning function. This multiplexer increases the set-up time and hold-time thereby adversely affecting the performance of the IC by reducing the overall clock frequency.

It is also desirable to provide for performance testing of IC production devices, which includes the ability to do scan-based performance characterization of the Application Specific Integrated Circuits (ASIC) devices. Because IC devices may vary in frequency as a result of the semiconductor processing, it is desirable to characterize the performance of ICs into different performance ranges such that the high performance devices can be distinguished from the lower performance devices. This type of performance testing is called "binning" since each performance range of devices is placed into a separate bin. Quite often, the conventional and time-consuming delay fault testing methods used for binning are not practicable for large volume production testing since production throughput will be significantly limited. In such a scenario, the technique of scan-based performance testing, using the scannable D-flip-flops in the present invention, can be a very quick and efficient method to accurately determine the frequency range of chips.

This is accomplished by constructing a test circuit that spans the entire silicon die area. By using a special AC-TEST-MODE control signal, the scannable D-flip-flops are set to a "flow-through" mode to provide a direct path through the scannable flip-flops such that the test circuit forms an oscillator such as a ring oscillator. Once the ring oscillator is formed, the frequency of the IC can be measured. The traditional mux-type-scan-D-flip-flop, which is comprised of a master and a slave component, allows only one component be turned ON at any given time thereby making it impossible to set the mux-type-scan-D-flip-flop in a "flow-through" mode to provide this type of performance testing. This is evident by the application of opposite polarity system clocks operating the master and slave components of the D-flip-flop.

DETAILED DESCRIPTION OF THE INVENTION

This description is given for the purpose of describing the general principles of the invention and is not to be taken in a limiting sense. The true scope of the invention should be determined with reference to the appended claims.

In order to appreciate and better understand the present invention, prior art latch circuits will first be discussed in conjunction with FIG. 3a which is a typical D-flop-flop latch circuit used in LSI and VLSI chips. The latch consists of two sections, master section 31, comprised of transmission gates 33 and 36 and inverters 34 and 35, and a slave section 32 comprised of transmission gates 37 and 40 and inverters 38 and 39.

Figure 3A:
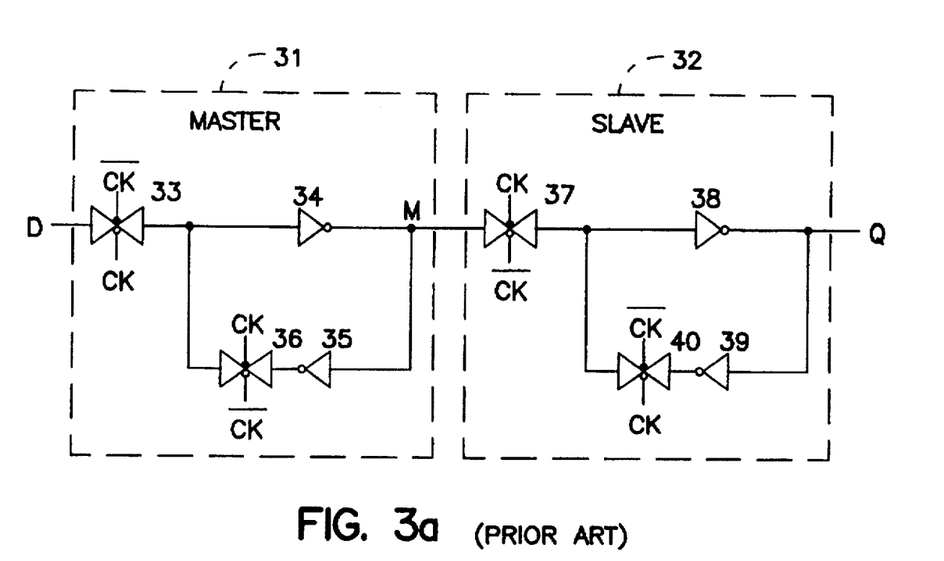
FIG. 3a depicts the prior art conventional D-flip-flop latch circuit.

Transmission gates 33, 36, 37 and 40, in the embodiment of FIG. 3a, are typically circuits that are turned on when the signal on the control input that is shown as a small empty circle is low, and turned off when the signal on that control input is high. When a transmission gate is turned on, the gate functions as a closed switch and a signal may pass through. When a transmission gate is turned off, it functions as an open switch and a signal is blocked from passing through. Other embodiments of transmission gates are well known and in each case they typically can be switched between an open switch and closed switch operation.

Figure 6A:
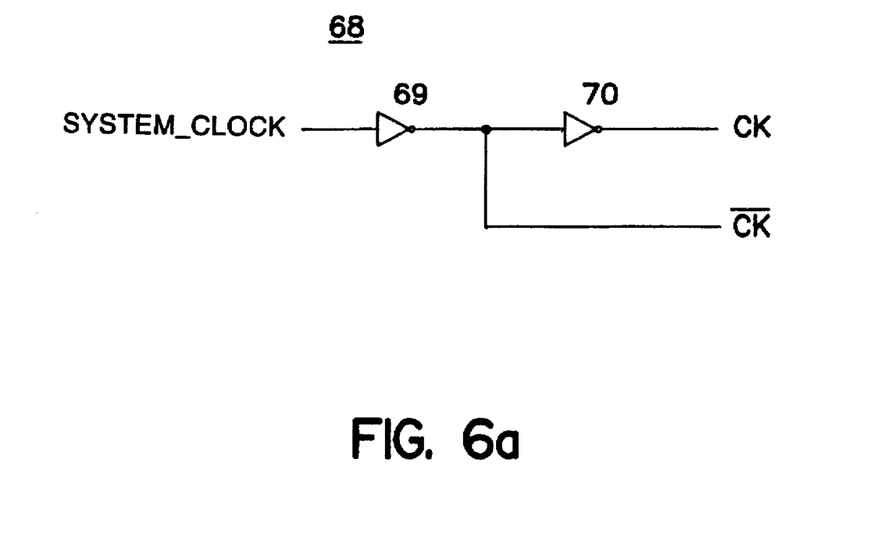
FIGS. 6a–b is a drawing of the system clock driver circuit and the scan/test clock driver circuit.

The signal CK is the system clock signal, while the signal CK_ is the complement of the system clock signal. Thus, CK and CK_ always have opposite logic values; when CK is high, CK_ is low, and vice-versa. The system clock driver circuit 68 is illustrated in FIG. 6a such that the system clock is coupled to inverter 69 and inverter 70. The output of inverter 69 provides the CK_ signal and the output of inverter 70 provides the CK signal. Inverters 34, 35, 38 and 39 are circuits whose output signal always have the opposite polarity of its input signal.

The latch in FIG. 3a functions in the following manner. When the clock signal CK_ is high, CK is low, and transmission gates 33 and 40 are turned on while transmission gates 36 and 37 are turned off. The input data signal, D, is passed through transmission gate 33, inverted by inverter 34, reinverted to its original polarity by inverter 35, but is blocked by transmission gate 36. The output of inverter 34 is blocked by transmission gate 37. When the clock signal reverses polarity, CK_ is low, CK is high, transmission gates 33 and 40 are turned off while transmission gates 36 and 37 are turned on. The signal on the output of inverter 34 (the same signal as D, but of opposite polarity) is thus applied to the input of inverter 38 and "latches" signal D into master section 31 of the latch since signal D will circulate through the loop formed by inverter 34 and 35.

At the same time, transmission gate 37 is turned on, and the input signal D, after a double inversion by inverters 34 and 38, appears on the output as the output data signal Q. When the clock signal goes low again, CK_ is high, CK is low and the transmission gates of the latch are back to their original condition. Since transmission gate 37 is turned off and transmission gate 40 is turned on, the signal D is now latched in the slave section 32 of the latch. It is apparent from FIG. 3a that D-flip-flop 30 operates in response to the system clock. It will be appreciated that numerous other circuit implementations are well known for master-slave flip-flops and these implementations may be utilized rather than the specific circuit shown in FIG. 3a, see, for example, the flip-flop of FIG. 8.52A on page 508 of The Art of Electronics, Horowitz & Hill, Cambridge University Press, 1989, (Second Edition).

Figure 3B:
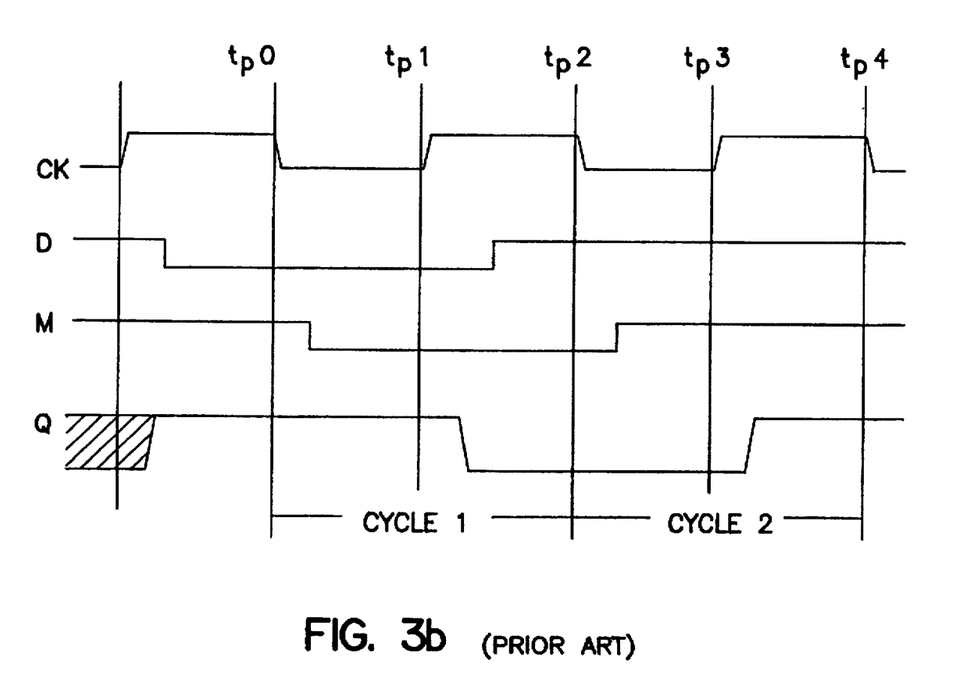
FIG. 3b is a timing diagram of the prior art conventional D-flip-flop latch circuit illustrating the input and output signals responding to the system clock.

FIG. 3b is a timing diagram for the latch of FIG. 3a, showing the input data signal D, the system clock signal CK, signal M at the output of master section 31, and signal Q at the output of slave section 32. Circuit delays are not shown in FIG. 3b in order to make the timing diagram easier to understand.

Still referring to FIG. 3b, it is seen that during a first clock sub-cycle, that is between times tp0 and tp1, the clock signal CK is low, transmission gate 33 is turned on, and signal M of master section 31 follows the input data signal D. At time tp1, at the beginning of the next clock sub-cycle, input data signal D latches into master section 31 and, since transmission gate 37 is turned on, passes on to the output of slave section 32 to provide output data signal Q. During the clock sub-cycle defined between tp1 and tp2, signal M of master section 31 is not affected by changes in signal D since transmission gate 33 is turned off and the signal Q at the output of slave section 32 remains constant. At tp2, the contents of master section 31 are latched in slave section 32. The clock sub-cycle between tp2 and tp3 is similar to that between tp0 and tp1 and signal M at the of master section 31 will again follow input data signal D.

As shown in FIG. 3b, a clock cycle may be defined as the time between the falling edges of the clock signal CK, e.g. tp0 to tp2, tp2 to tp4, etc (although it may also be defined as the time between rising edges of CK). The master-slave latch ensures that the output Q of the latch will be constant during the entire cycle tp1 to tp3, unaffected by changes on the input, and will have the same logic level the input had just prior to the start of the cycle.

Figure 4:
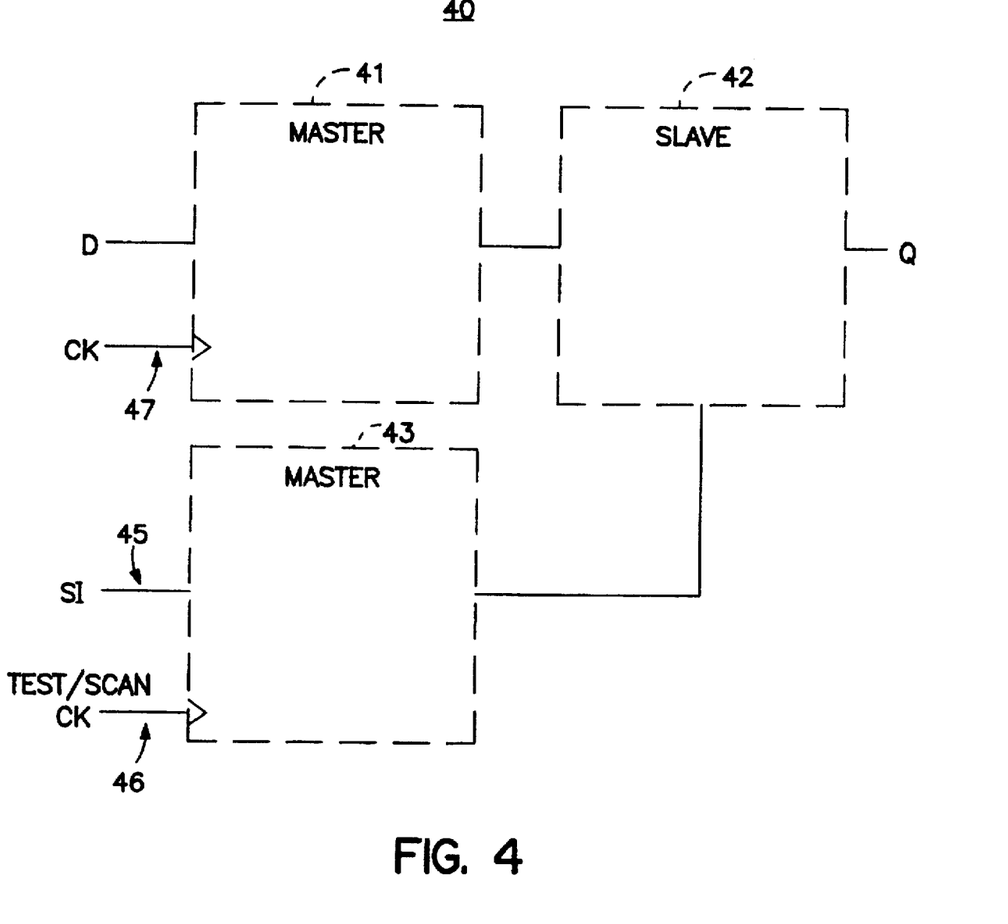
FIG. 4 is a block diagram of the preferred embodiment of the present invention.

The preferred embodiment of the present invention is a scannable D-flip-flop latch circuit which includes two master sections, 41 and 43, and one slave section 42 as shown in FIG. 4. Unlike the conventional D-flip-flop described above with reference to FIG. 3a, a scannable D-flip-flop has the ability of selecting between a normal mode of operation and a test/scan mode of operation. The normal mode refers to the scannable-D-flip-flop operating (under control of the system clock CK at input 47 of the master latch 41) in a manner similar to the conventional D-flip-flop described above with reference to FIG. 3a. The test/scan mode of the scannable-D-flip-flop provides the ability to control and observe the values stored in the scannable-D-flip-flops without affecting the data in the non-scannable flip-flops. The test/scan mode is most commonly used in scan designs such that the scannable D-flop-flops are connected serially to form one or more shift registers thereby having the ability to shift any state into or out of the scannable D-flip-flop. Master section 41 is dependent on the system clock whereas master section 43 receives the scan-in (SI) input signal at input 45 and is dependent on the scan/test clock signal supplied at input 46 such that the architecture of the present invention enables the scanning of external test data independent of the system clock; thus, making the present invention an excellent vehicle for highly efficient "partial-scan based sequential" automatic-test-pattern-generation (ATPG). Furthermore, when the scan/test mode of operation is selected, a special performance testing function may be specified.

Figure 5A:
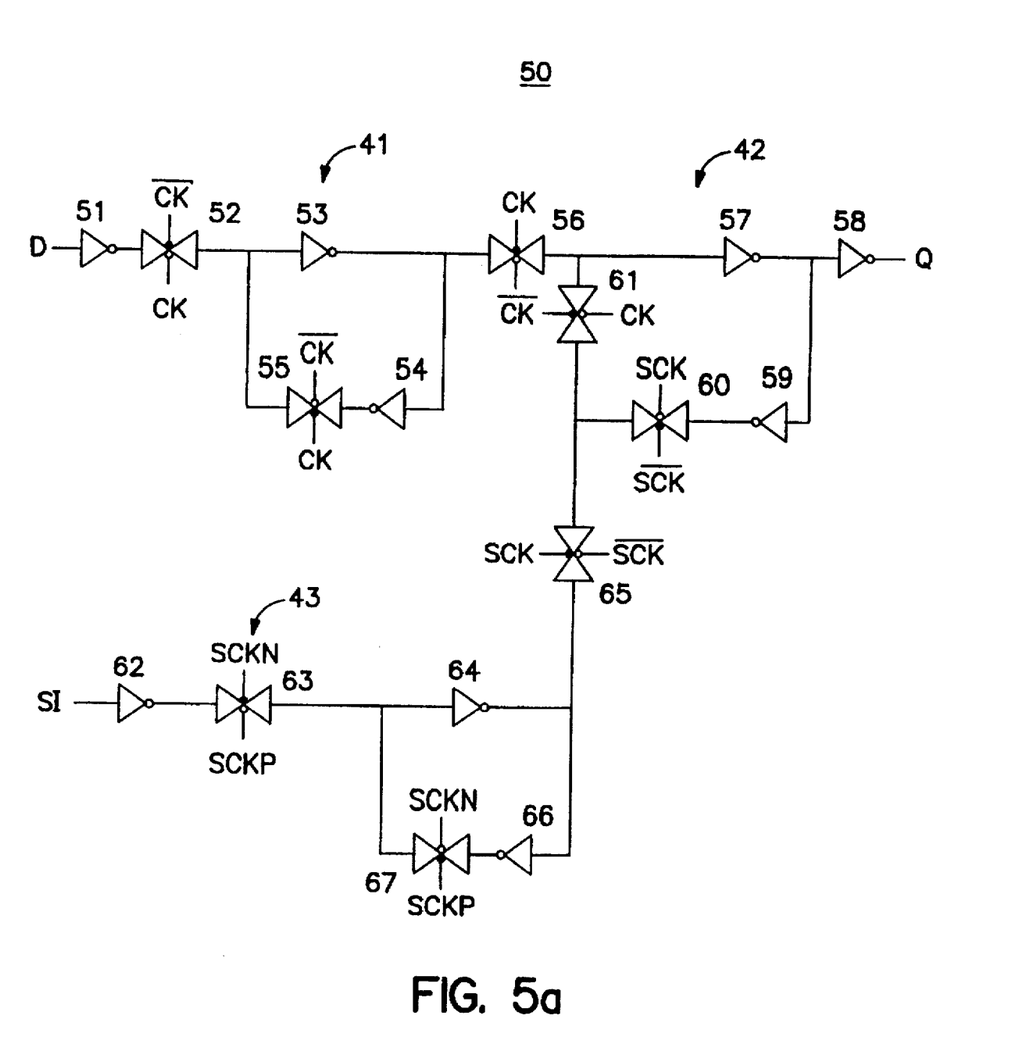
FIG. 5a is a detailed diagram of the preferred embodiment of the present invention.
Figure 5B:
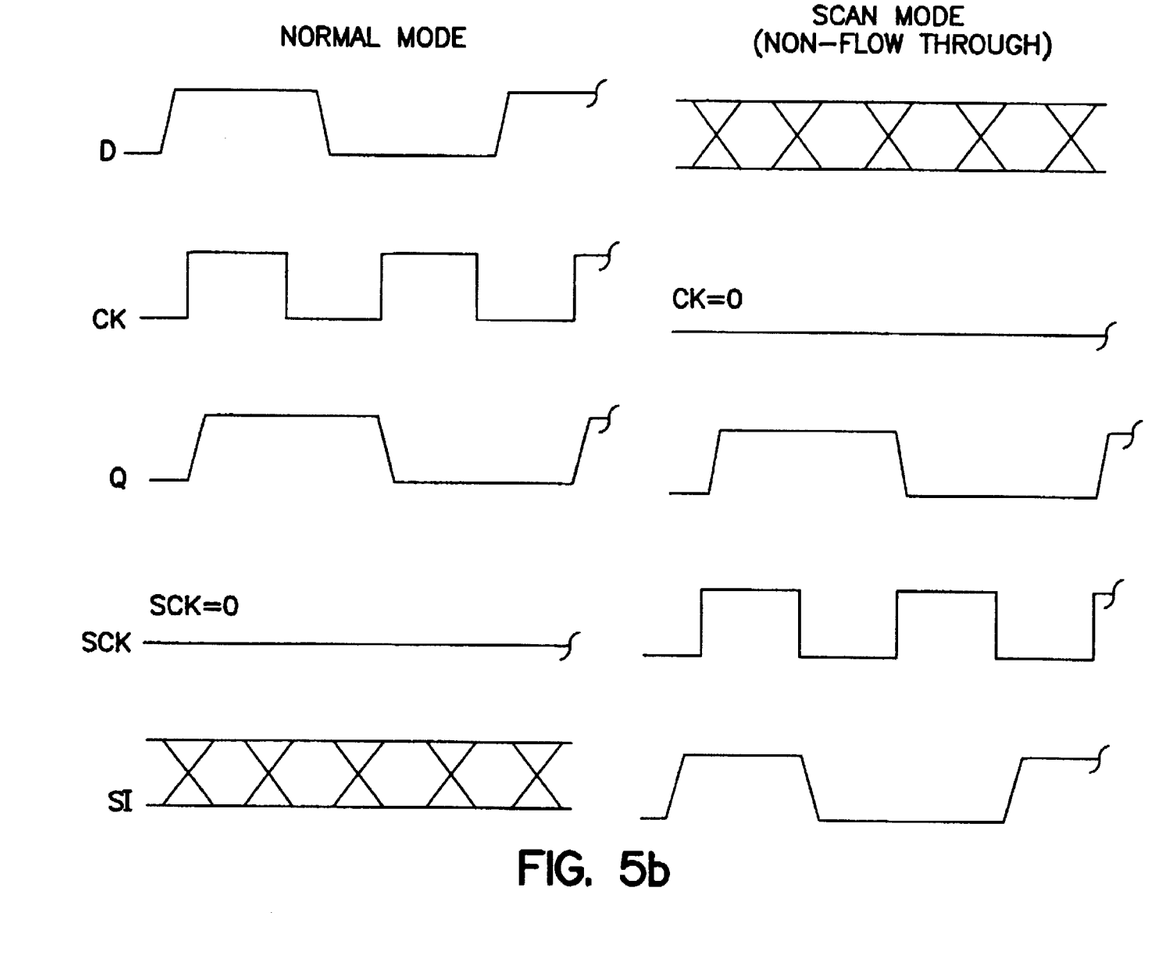
FIG. 5b is a timing diagram showing the operation of the scannable-D-flip-flop in both normal and scan modes.

The advantages of present invention will become more apparent, particularly with respect to partial-scan applications, as the embodiment illustrated in FIG. 5a is described in further detail. In normal operation ("normal mode"), the system clock, CK, is running such that master section 41 is operating in conjunction with slave section 42. This is shown in FIG. 5b. Also note that the scan clock signal SCK is kept low during normal operation. On a first subcycle when system clock CK is low and CK_ is high, transmission gates 52 and 61 are turned on and transmission gates 55 and 56 are turned off. In normal mode, transmission gate 60 is on (as SCK is low). The input data signal D is inverted by inverter 51, reinverted to its original polarity by inverter 53, and then inverted by inverter 54. Since transmission gates 56 and 55 are turned off, the input data signal D is prevented from passing from master section 41 to slave section 42 and from latching into master section 41.

On a second subcycle of a system clock, when CK is high and CK_ is low, transmission gates 52 and 61 are turned off and transmission gates 55 and 56 are turned on such that the input signal D latches into master section 41 by circling the loop formed by inverter 53 and 54. Furthermore, the input signal D is passed from master section 41 to slave section 42 (through the "on" transmission gate 56), inverted by inverter 57, and reinverted to its original polarity by inverter 58 and appearing as the output signal Q. During the second subcycle, the output of master section 41 is unaffected by any change in value of data input signal D at the input of master section 41.

During a third subcycle of a system clock, transmission gates 52 and 61 are turned on and transmission gates 55 and 56 are turned off. Given that the scan clock signal SCK is low and SCK_ is high such that transmission gate 60 is turned on during normal operation, the input data signal D will latch into slave section 42 by circling the loop formed by inverter 57 and 59. During the third subcycle, slave section 42 is unaffected by any change in value of the data input signal at the output of master section 41 and the data input signal which is latched into slave section 42 appears as the output signal Q, available at the output of slave section 42. Although the slave section 42 is unable to receive a new data input signal D during the third subcycle when transmission gate 56 is turned off, transmission gate 52 in master section 41 is turned on again such that master section 41 is ready to receive a new data input signal D at the input of master section 41.

It will be appreciated that the scannable D-flip-flop of the present invention, as is the case with most flip-flops, requires that the input data be valid and stable a minimum amount of time (so called "set-up time") before the triggering edge of the clock (in the case of a flip-flop which latches the D input into the flip-flop on the rising edge of the clock, then the triggering edge is the rising edge), and further requires that the input data be valid a stable minimum amount of time (so called "hold time") after the triggering edge. Unlike other scannable D-flip-flops (e.g. the mux-type-scan-D-flip-flop), the flip-flop of the present invention does not require an extended set-up time relative to non-scannable flip-flops, but the hold time is a bit extended (5%) relative to the non-scannable flip-flops. This restriction however is acceptable as set-up time more critically affects circuit design and performance and thus this hold-time requirement of the flip-flop of the invention does not significantly adversely impact overall circuit performance.

In the test/scan mode of operation, the test/scan clock, SCK, is running such that master section 43 is operating in conjunction with slave section 42 and the system clock CK is normally kept low in order to preserve signal states in the non-scannable flip-flops on the IC. This is shown in that test/scan mode of operation provides the ability to select between a scan mode of operation and a performance test mode of operation by asserting an AC_TEST_MODE control signal in the test/scan clock driver circuit in FIG. 6b. When the AC_TEST_MODE control signal is asserted low, the scan mode of operation is selected such that master slave 43 operates in conjunction with slave section 42 similar to the conventional D-flip-flop described above. When the AC_TEST_MODE control signal is asserted high, the test mode of operation is selected such that the master section 43 and the slave section 42 operates together to provide a performance test function for an integrated circuit device in which the scannable D-flip-flops are located. A more detailed discussion of the scan and test modes will be described below.

Figure 6B:
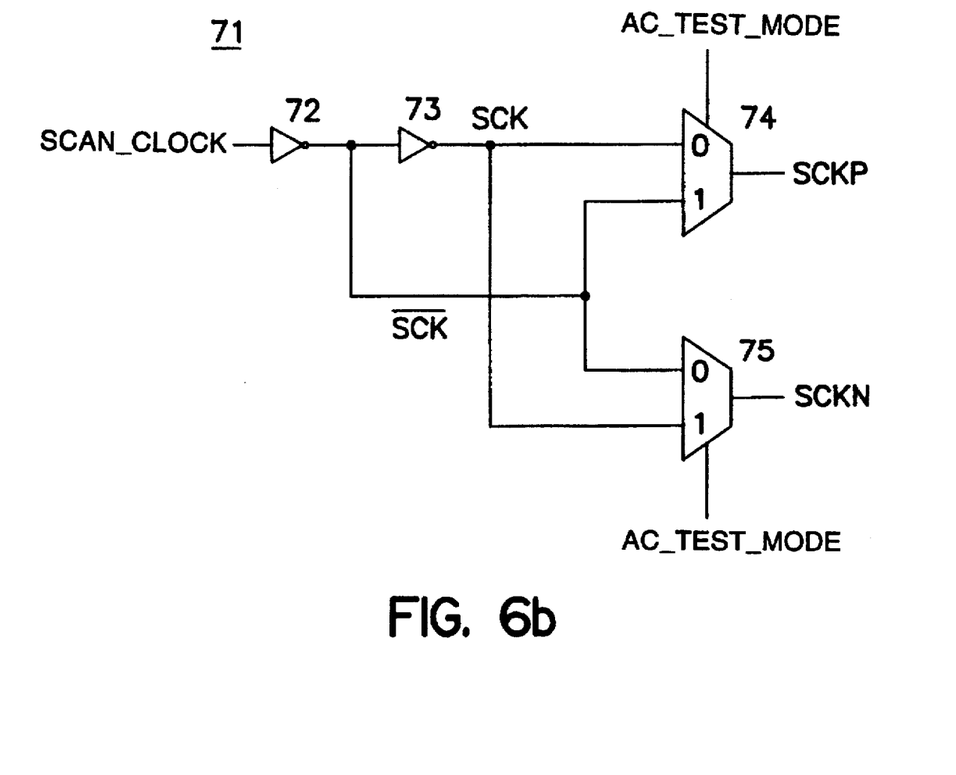

When the scan mode is selected (AC_TEST_MODE is low), the "0" input lines of multiplexers 74 and 75 of the scan clock driver circuit in FIG. 6b are selected. The input of scan clock driver circuit 71 receives the scan clock signal SCK and is coupled to inverter 72 which is coupled to the "0" input select line of multiplexer 75 such that the output of multiplexer 75, SCKN, has the opposite polarity of SCK in the scan mode. Furthermore, the input of the scan clock driver circuit is coupled to inverter 72 which is coupled to the "0" input select line of multiplexer 74 through inverter 73 such that the output of multiplexer 74, SCKP, has the same polarity as SCK in the scan mode.

On a first subcycle of the scan clock signal, when SCK is low and SCK_ is high such that SCKP is low and SCKN is high, transmission gates 65 and 60 are turned on and transmission gates 65 and 67 are turned off. The input data signal D is inverted by inverter 62, reinverted to its original polarity by inverter 64, and then inverted by inverter 66. Since transmission gates 65 and 67 are turned off, the input data signal SI is prevented from passing from master section 43 to slave section 42 and from latching into master section 43.

On a second subcycle of the scan clock signal, when SCK is high and SCK__ is low such that SCKP is high and SCKN is low, transmission gates 63 and 60 are turned off and transmission gates 65 and 67 are turned on such that the input signal SI latches into master section 43 by circling the loop formed by inverters 64 and 66. Furthermore assuming the system clock signal CK is low and CK__ is high such that transmission gate 61 is turned on during the scan mode, the input signal SI is passed from master section 43 to slave section 42, inverted by inverter 57, and reinverted to its original polarity by inverter 58 and appearing as the output signal Q. During the second subcycle, master section 43 is unaffected by any change in value of data input signal SI at the input of master section 43.

During a third subcycle the scan clock signal, transmission gates 63 and 60 are turned on and transmission gates 65 and 67 are turned off. The prior input data signal SI will latch into slave section 42 by circling the loop formed by inverter 57 and 59. During the third subcycle, slave section 42 is unaffected by any change in value of the data input signal SI at the output of master section and the data input signal SI which is latched into slave section 42 is available at the output of slave section 42. Although the slave section 42 is unable to receive a new data input signal SI during the third subcycle when transmission gate 65 is turned off, transmission gate 62 in master section 43 is turned on again such that master section 43 is ready to receive a new data input signal SI at the input of master section 43.

Figure 7:
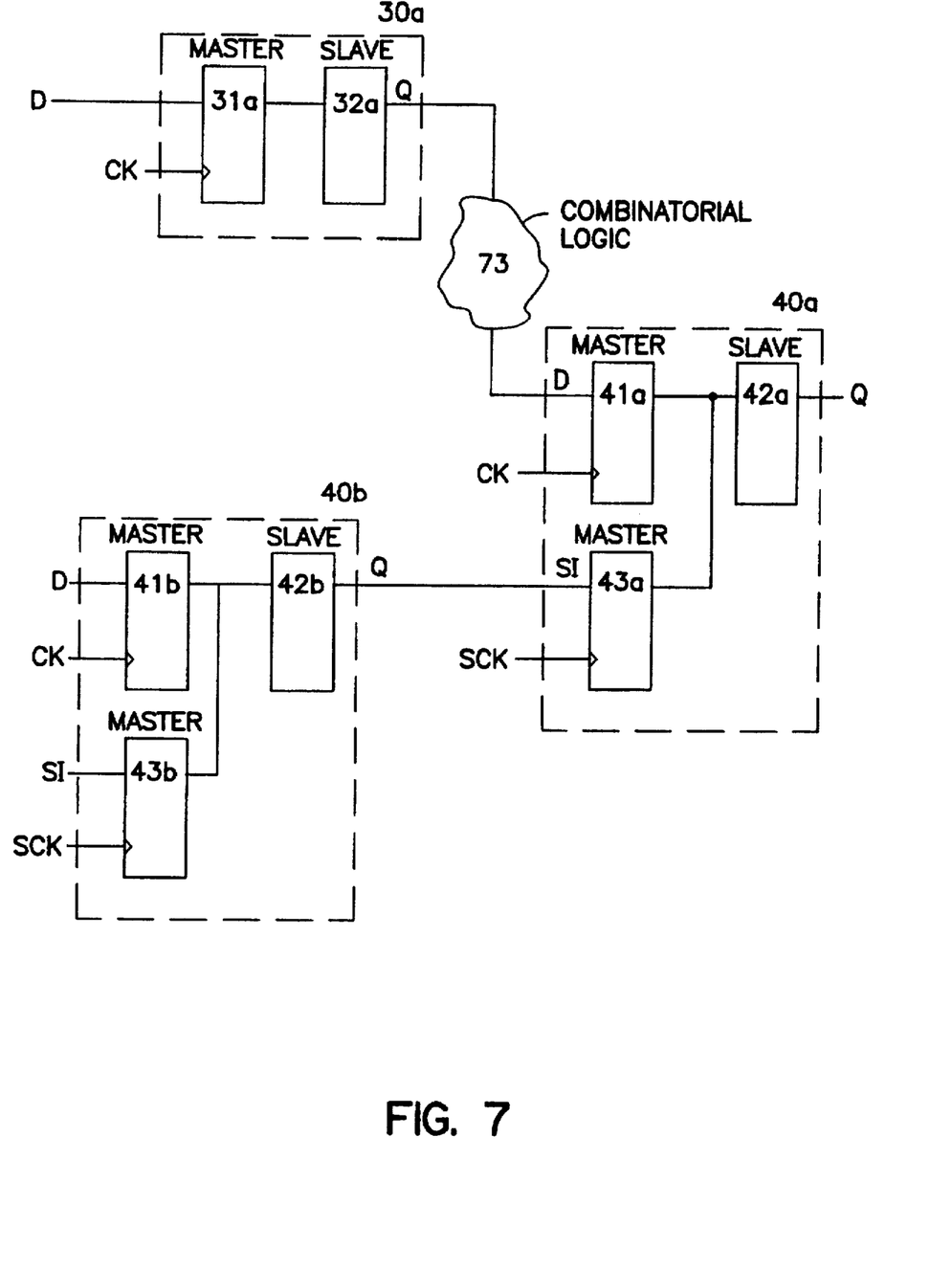
FIG. 7 illustrates a partial scan chain ultilizing both conventional D-flip-flops and scannable-D-flip-flops.

As mentioned above, the improved scannable-D-flip-flop in the present invention is excellent for "partial-scan based sequential" applications. FIG. 7 illustrates a partial scan application in which both conventional D-flip-flops and scannable-D-flip-flops are serially connected to form a partial scan chain. Partial scan chain 70 may be extended to increase the number of conventional D-flip-flops and scannable-D-flip-flops to meet the specific testing requirements of the IC device under test. In FIG. 7, blocks 30a illustrates a conventional D-flip-flop while blocks 40a and 40b illustrate the scannable-D-flip-flop of the present invention. Conventional D-flip-flop 30a, including master section 31a and slave section 32a, is coupled to scannable-D-flip-flop 40a, including master section 41a and slave section 42a, through combinatorial logic 73. When the system clock is active, normal operation takes place and D-flip-flop 30a and scannable D-flip-flop 40a operate as conventional D-flip-flops (i.e. date storage elements). The data output signal Q from D-flip-flop 30a provides the data input signal into combinatorial logic 73. Combinatorial logic 73 then performs its specific logic operation on signal Q to provides a data input signal D to scannable-D-flip-flop 40a. The data input signal D into scannable D-flip-flop 40a is then stored in master section 41a and slave section 42a.

When scan/test mode of operation is selected, data input signal SI is scanned into scannable-D-flip-flop 40b. The output of scannable-D-flip-flop 40b is directly connected to the scanin (SI) input of scannable-D-flip-flop 40a. The data input signal SI into master latch 43b shifts through to slave latch 42b to the output of scannable-D-flip-flop 40b. The resulting signal is shifted into master latch 43a of scannable-D-flip-flop 40a under control of the scan clock signal SCK and is eventually scanned out to the output of scannable D-flip-flop 40a. Due to the fact that the master sections and slave sections in scannable D-flip-flops 40a and 40b operate in response to the scan clock signal SCK (rather than the system clock CK), the data stored in the latches which operate in response to the system clock (i.e. D-flip-flop 30a and master sections 41a and 41b in scannable-D-flip-flops 40a and 40b respectively) will not be lost when scan/test mode of operation is selected.

The ability to scan external test data independent of the system clock produces significantly higher fault coverages and more efficient test generation times for "partial-scan" applications. This enhanced architecture allows the non-scannable-D-flip-flops in the design to maintain their previous states thereby providing a major boost in automatic-test-pattern-generation (ATPG) efficiency and effectiveness. In contrast, using a conventional mux-type-scan-D-flip-flop requires usage of the system clock by both the scannable and non-scannable D-flip-flops. Furthermore, by not requiring the system clock for scan operation, the ATPG tool can choose fewer D-flip-flops in the design that need to be scanned, thereby reducing the overall scan-test-logic silicon area overhead required by the design to achieve a high fault coverage. Since this partial scan design requires only one extra clock for the scan-test operation, the scan-test-area overhead and routing overhead at the device level is maintained at significantly lower levels.

Another important feature is that the improved scannable-D-flip-flop device has no impact on the "setup-time" and minimal impact on the "hold-time" required on the functional path of the D-flip-flop. In the conventional mux-type-scan-D-flip-flop, a multiplexer device is placed on the functional input path of non-scannable D-flip-flops to achieve the scanning function. This multiplexer adversely impacts the performance of the mux-type-scan-D-flip-flop by increasing the "setup-time" and "hold-time" on the functional path of the D-flip-flop thereby reducing the overall performance frequency of the integrated circuit particularly in an ASIC design. Although, the "setup-time" in the present invention is not adversely affected, the "hold-time" is slightly affected as a result of slave latch 42 in the present invention having an additional transmission gate relative to slave latch 30 in the mux-type-scan-D-flip-flip.

When the test mode is selected (AC__TEST__MODE is high), the "1" input lines of multiplexers 74 and 75 of the scan clock driver circuit in FIG. 6b are selected. The input of the scan clock driver circuit is coupled to inverter 72 which is coupled to the "1" input select line of multiplexer 74 such that the output of multiplexer 74, SCKP, has the opposite polarity of SCK in the test mode. Furthermore, the input of the scan clock driver circuit is coupled to inverter 72 which is coupled to inverter 73 which is coupled to the "1" input select line of multiplexer 75 such that the output of multiplexer 75, SCKN, has the same polarity as SCK in the scan mode.

Referring back to FIG. 5 which is a detailed schematic of the preferred embodiment of the present invention, in the test mode when SCK is kept high and SCK__ is kept low such that SCKN is high and SCKP is low, transmission gates 63 and 65 are turned on and transmission gates 67 and 60 are turned off. Furthermore, assuming that CK is kept low and CK__ is kept high (as they should be in the test mode) such that transmission gate 61 is turned on, the data input signal SI in inverted by inverter 62, reinverted to its original polarity by inverter 64, inverted by inverter 57, reinverted to its original polarity by inverter 58 thereby providing a data output signal Q. In otherwords, a direct path is formed from data input SI of the scannable-D-flip-flop through to the output Q of the scannable-D-flip-flop which includes only the circuit delays through inverters 62, 64, 57, and 58. The scannable D-flip-flop with this direct path, is now in "flow-through" mode.

This special test function enables the scannable-D-flip-flops to be used for performance testing of IC devices during the "AC_TEST_MODE" operation in the test mode. The performance testing of IC devices includes the ability to do scan-based performance characterization of ASIC devices. The purpose of performance testing is to characterize the frequency ranges of production parts into one or more groups such that the different groups may be separated into different bins during testing. For example, an ASIC part which has been designed to perform at 50 MHz, may perform across a range of frequencies, as a result of process variations, such that the devices may operate from 40 MHz (weaker process) to 60 MHz (stronger process). By characterizing these devices into more specific frequency groups, the devices may be characterized as operating between 40–50 MHz, 45–50 MHz, or 55–60 Mhz such that the devices may be binned accordingly.

The frequency ranges of performance delays is predicted through timing simulation such that the "minimum" (best case), "typical" (normal), and "maximum" (worst case) is simulated. The signal and gate delays in the design can be extracted after the placement and routing is completed. These delays are fed into a timing simulation tool to estimate the frequencies at minimum, typical, and max processes of the oscillator constructed out of the scan chain during the AC_TEST_MODE. During production testing of the silicon parts, the actual measured frequency of the part in the AC_TEST_MODE is compared with the estimated frequency from the timing tool, thereby characterizing the part to a particular frequency range bin.

Figure 8A:
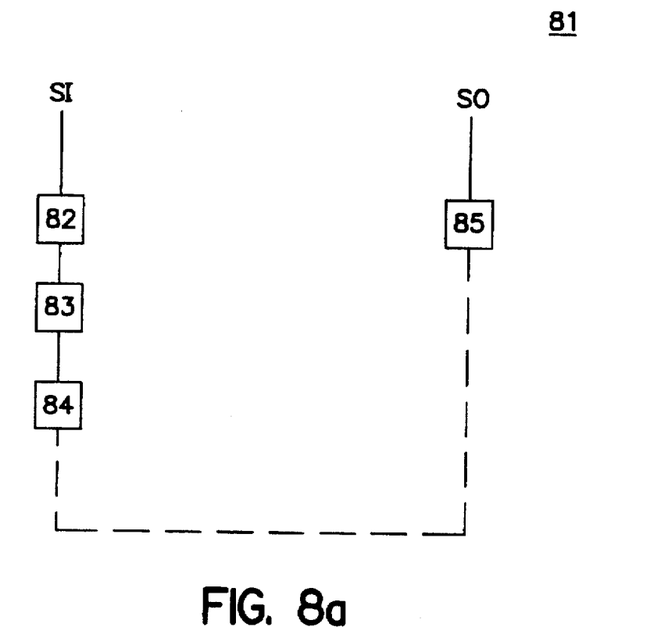
FIGS. 8a–b illustrate the test circuitry for the performance testing function at the chip level of the present invention.

This performance testing method requires that the scannable-D-flip-flops be connected serially to form a chain such that when each scannable-D-flip-flop is set in the "flow-through" mode a direct path from the input, SI, of the first scannable flip-flop in the chain of scannable-D-flip-flops through to the output, SO, of the last scannable flip-flop in the chain of scannable-D-flip-flops is formed thereby creating test circuit 81 in FIG. 8a. In FIG. 8a, scannable-D-flip-flops 82, 83, 84 and 85 connected serially to form a chain of scannable-D-flip-flops connected between the first input SI to the last output SO. Note that the traditional mux-type-scan-D-flip-flop can not provide this performance testing functionality since master section 31 and slave section 32 requires that either master section 31 or slave section 32 be turned ON at any given time. This is evident by the application of opposite polarity system clocks operating both master section 31 and slave section 32.

Figure 9:
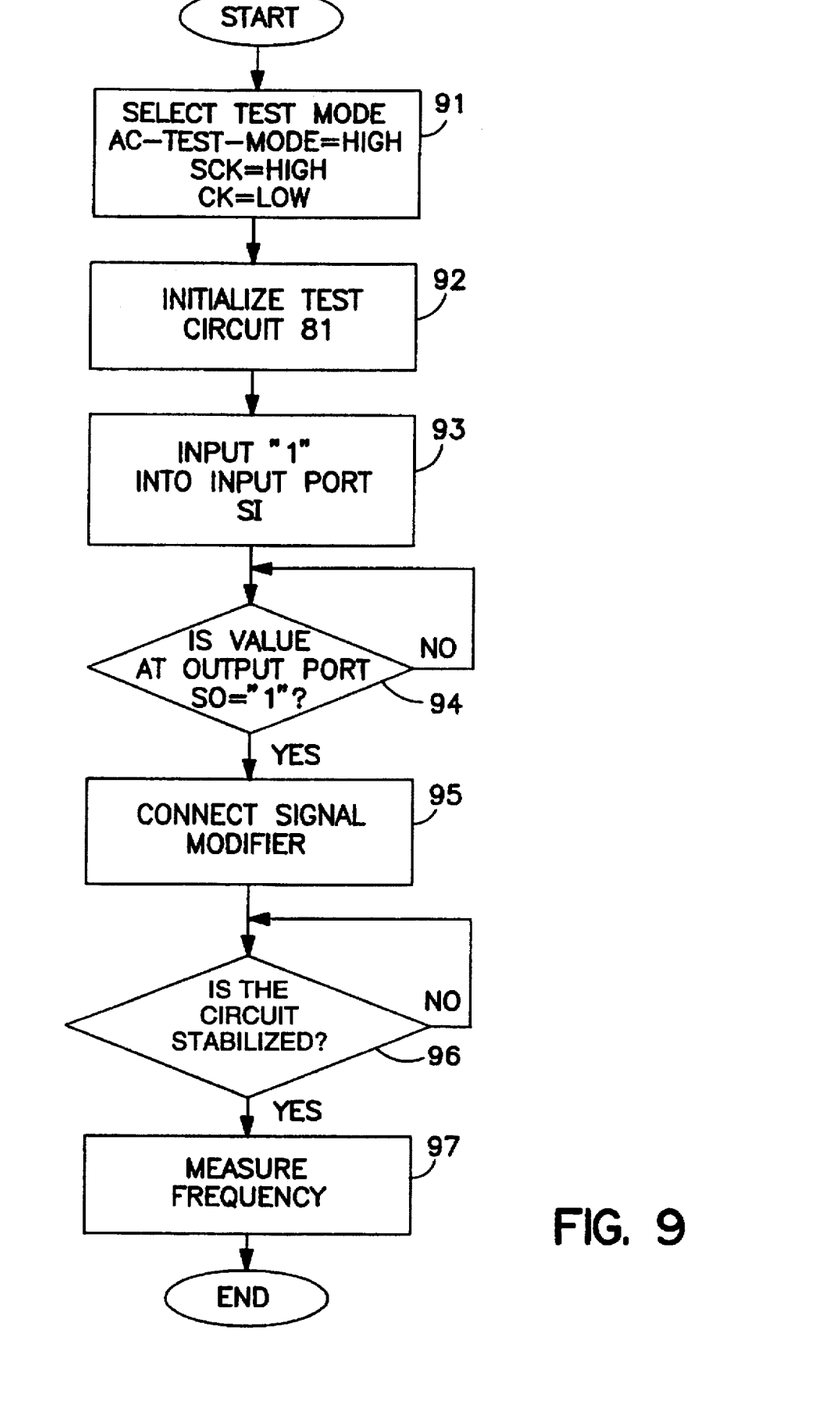
FIG. 9 illustrates a method for testing according to the present invention.

FIG. 9 illustrates a flow-chart of the performance testing method. The first step in the performance testing method of the preferred embodiment is to select the test mode (AC_TEST_MODE is high) and set the SCK signal high and the CK signal low as shown in box 91, and to initialize test circuit 81 as shown in box 92, by inputting a "0" (or another known value) at the input port SI of test circuit 81 and waiting to observe a "0" at SO. Alternatively, the method may begin by selecting the scan mode (AC_TEST is low) and using the scan clock signal SCK to clock into the chain of scannable D-flip-flops a known value (e.g. all zeros) to "clear" all D-flip-flops to the same, known value, if N (e.g. 100) scannable D-flip-flops are in the chain then N (e.g. 100) zeros are clocked into the chain. At this point, the test mode is selected and SCK is set high and CK is set low, and the method proceeds to the second step.

The second step in the performance testing, illustrated by box 93, is to provide the input port SI in test circuit 81 with a "1" (or another known value which is different from the initializing value) after the "0" has been observed at SO and then to wait for the "1" to appear at the output SO of test circuit 81, as illustrated by box 94. The "1" appearing at the output SO indicates that the "flow-through" mode of test circuit 81 is operating correctly such that the value inputted into SI will appear at the output SO after a certain delay period. Each scannable-D-flip-flop provides a circuit delay such that the delay period of test circuit 81 is dependent on the number of scannable-D-flip-flops connected serially and on the processing involved in fabricating the IC which contains the chain of scannable flip-flops.

Figure 8B:
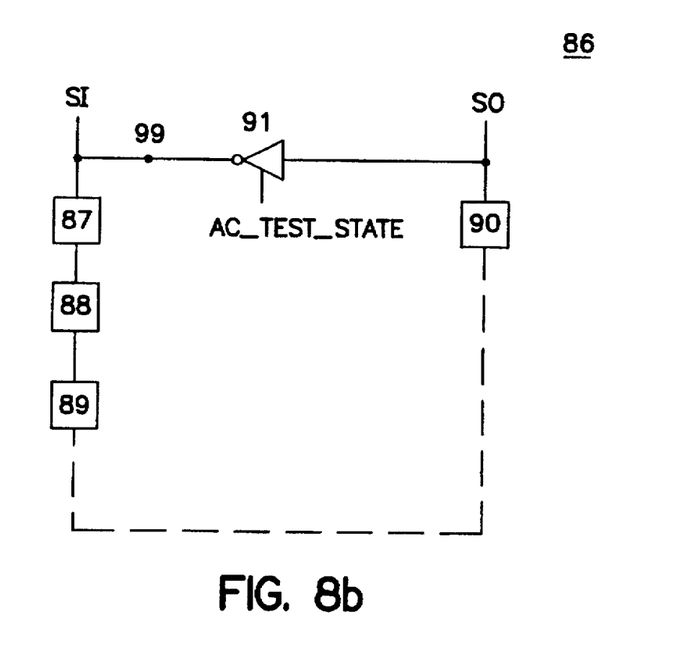

Box 95 illustrates the third step in applying this method of performance testing such that a ring is formed by coupling the input SI of test circuit 81 to the output SO of test circuit 81 through a signal modifier. See FIG. 8b. For example, the signal modifier may be a tri-state inverter such that the output SO of test circuit 81 may be connected to the input of a tri-state inverter 91 and the input SI of test circuit 81 may be connected to the output of the tri-state inverter 91. When the AC_TEST_STATE control signal of inverter 91 is deasserted, inverter 91 operates in a high-impedance state such that the signal initiated at the input SI of test circuit 81 which flows through test circuit 81 to the output SO of test circuit 81 is stopped from passing through inverter 91. When inverter 91 is operating in the high-impedance state, the data input signal is blocked from looping around ring circuit 86. On the other hand, when AC_TEST_STATE control signal of inverter 91 is asserted, inverter 91 operates as an inverter such that the data input signal may loop around ring circuit 86 thereby forming an oscillator. That is, the "0" changes to a "1" and then to a "0", and so on, such that a value/signal measured at point 99 which oscillates at a frequency which is dependent on the circuit delay of the chain of scannable flip-flops.

Once a ring oscillator is formed, the fourth step may be performed after the circuit stabilizes as shown by box 96. The fourth step, illustrated by box 97, consists of measuring the frequency of test circuit 81. This frequency allows one to ascertain the performancy (e.g. speed) of the IC which contains the chain.

I claim:

1. A scannable D-flip-flop circuit for processing data bits, said scannable D-flip-flop circuit comprising:
    (a) a first latch circuit coupled to a first input of said scannable D-flip-flop, said first latch circuit receives a first data input signal and a first clock signal and stores said first data input signal in response to said first clock signal during a normal mode of operation, said first latch having an output;
    (b) a second latch circuit coupled to a second input of said scannable D-flip-flop, said second latch circuit receives a second data input signal and a second clock signal and stores said second data input signal in response to said second clock signal during a scan mode of operation, said second latch having an output;
    (c) a third latch circuit having a data path and a feedback path wherein said data path is coupled to said output of said first latch circuit and said feedback path is coupled to said output of said second latch circuit, said third latch circuit receives said first data input signal and said first clock signal and stores said first data input signal in response to said first clock signal during said normal mode of operation, said third latch circuit receives said second data input signal and said second clock signal and stores said second data input signal in response to said second clock signal during said scan mode of operation, said third latch circuit is coupled to an output of said D-flip-flop.

2. The scannable D-flip-flop circuit of claim 1, wherein said first and third latch circuits operate respectively as master and slave latch circuits in response to said first clock signal, and said second and third latch circuits operate respectively as master and slave latch circuits in response to said second clock signal.

3. The scannable D-flip-flop circuit of claim 1, wherein said first latch circuit comprises a first inverter having an input coupled to said first input of said scannable D-flip-flop, said first inverter having an output coupled to an input of a first transmission gate, said first transmission gate having an output coupled to an input of a second inverter, said second inverter having an output coupled to an output of said first latch circuit, said second inverter having said output coupled to an input of a third inverter, said third inverter having an output coupled to an input of a third transmission gate, said third transmission gate having an output coupled to said output of said first transmission gate;

during a first clock subcycle when a first signal of said first clock is in a first state, said first data input signal of said first latch circuit passes through to said output of said first latch circuit but is prevented from passing through to said input of said third latch circuit, furthermore, said first data input signal of said first latch circuit is prevented from latching into said first latch circuit;

during a second clock subcycle when said first signal of said first clock is in a second state, said first data input signal of said first latch circuit latches into said first latch circuit and passes through to said input of said third latch circuit.

4. The scannable D-flip-flop circuit of claim 3, wherein said third latch circuit comprises said second transmission gate having an input coupled to said input of said third latch circuit, said second transmission gate having an output coupled to an input of a fourth inverter, said fourth inverter having an output coupled to an input of a fifth inverter and coupled to an input of a sixth inverter having an output coupled to an output of said third latch circuit which is coupled to the output of said scannable D-flip-flop, said fifth inverter having an output coupled to an input of a fourth transmission gate, said fourth transmission gate having an output coupled to an input of a fifth transmission gate, said fifth transmission gate having an output coupled to said input of said fourth inverter and said output of said second transmission gate;

during said second clock subcycle when said first signal of said first clock is in said second state, said first data input signal of said first latch circuit passes from said output of said first latch circuit to said input of third latch circuit and through to said output of said third latch circuit, furthermore, said first data input signal of said first latch circuit is prevented from latching into said third latch circuit;

during a third clock subcycle when said first signal of said first clock is in said first state, said first data input signal of said first latch circuit that passes to said input of said third latch circuit during said second clock subcycle latches into said third latch circuit.

5. The scannable D-flip-flop circuit of claim 4, wherein said first latch circuit is available to receive a new first data input signal during said third clock subcycle.

6. The scannable D-flip-flop circuit of claim 1, wherein said second latch comprises a seventh inverter having an input coupled to said second input of said scannable D-flip-flop, said seventh inverter having an output coupled to an input of a sixth transmission gate, said sixth transmission gate having an output coupled to an input of an eighth inverter, said eighth inverter having an output coupled to an output of said second latch circuit and to an input of a ninth inverter, said ninth inverter having an output coupled to an input of a eighth transmission gate, said eighth transmission gate having an output coupled to said output of said sixth transmission gate;

during a first clock subcycle when a second signal of said second clock is in a first state and a control signal for selecting between a normal mode and a test mode of a scan clock driver circuit selects said normal mode of said scan clock driver circuit, said second data input signal of said second latch circuit passes through to said output of said second latch circuit but is prevented from passing through to said input of said third latch circuit, furthermore, said second data input signal of said second latch circuit is prevented from latching into said second latch circuit;

during a second clock subcycle when said second signal of said second clock is in a second state and said normal mode of said scan clock driver circuit is selected, said second data input signal of said second latch circuit latches into said second latch circuit and passes through to said input of said third latch circuit.

7. The scannable D-flip-flop circuit of claim 6, wherein said third latch circuit comprises a seventh transmission gate having an input coupled to an input of said third latch circuit, said seventh transmission gate having an output coupled to an input of a fourth inverter, said fourth inverter having an output coupled to an input of a sixth inverter having an output coupled to an output of said third latch circuit which is coupled to said output of said scannable D-flip-flop, said output of said fourth inverter further coupled to an input of a fifth inverter, said fifth inverter having an output coupled to an input of a fourth transmssion gate, said fourth transmission gate having an output coupled to an input of a fifth transmission gate, said fifth transmission gate having an output coupled to said output of said seventh transmission gate;

wherein said seventh transmission gate, said fourth inverter and said sixth inverter form said data path of said third latch circuit and said fifth inverter, said fourth transmission gate and said fifth transmission gate form said feedback path of said third latch circuit;

during said second clock subcycle when said second signal of said second clock is in said second state, said second data input signal of said second latch circuit passes from said output of said second latch circuit to said input of said third latch circuit and through to said output of said third latch circuit, furthermore, said second data input signal of said second latch circuit is prevented from latching into said third latch circuit;

during a third clock subcycle when said second signal of said second clock is in said first state, said second data input signal of said second latch circuit that passes to said input of said third latch circuit during said second clock subcycle latches into said third latch circuit.

8. The scannable D-flip-flop circuit of claim 7, wherein said second latch circuit is available to receive a new second data input signal during said third clock subcycle.

9. The scannable D-flip-flop circuit of claim 1, wherein said first clock generates a first clock signal from a system clock and a clock driver circuit, said first clock operates independently from said second clock.

10. The scannable D-flip-flop circuit of claim 1, wherein said second clock generates a second clock signal from a scan clock and a scan clock driver circuit, said second clock operates independently from said first clock.

11. The scannable D-flip-flop of claim 10, wherein said scan clock driver circuit comprises a first inverter having an input coupled to said input of said scan clock driver circuit, said first inverter having an output coupled to said input of a second inverter and a first input of a first multiplexer and a first input of a second multiplexer, said second inverter having an output coupled to a second input of said first multiplexer and a second input of said second multiplexer, said first multiplexer having an output coupled to a first output of said scan clock driver circuit, said second multiplexer having an output coupled to a second output of said scan clock driver circuit;

said scan clock driver circuit further comprises a control signal wherein said control signal selects a normal mode of operation of said scannable D-flip-flop or a test mode of operation of said scannable D-flip-flop, said normal mode of operation of said scannable D-flip-flop enables said second and third latch circuits to operate respectively as master and slave latch circuits in response to said second clock signal, said test mode of operation of said scannable D-flip-flop enables said second and third latch circuits to provide a direct path from said input of said second latch circuit to said output of said third latch circuit to provide a performance testing function for a device which contains said scannable D-flip-flops.

12. The scannable D-flip-flop circuit of claim 1, wherein said second clock signal is an edge-triggered clock signal.

* * * * *